US007992186B2

(12) United States Patent
Kasuya

(10) Patent No.: US 7,992,186 B2
(45) Date of Patent: Aug. 2, 2011

(54) BROADCASTING RECEIVER AND VOLUME CONTROL METHOD THEREOF

(75) Inventor: Takuya Kasuya, Kadoma (JP)

(73) Assignee: Panasonic Corporation, Osaka (JP)

( * ) Notice: Subject to any disclaimer, the term of this patent is extended or adjusted under 35 U.S.C. 154(b) by 723 days.

(21) Appl. No.: 12/051,561

(22) Filed: Mar. 19, 2008

(65) Prior Publication Data

US 2008/0235753 A1   Sep. 25, 2008

(30) Foreign Application Priority Data

Mar. 20, 2007   (JP) ................................. 2007-072288

(51) Int. Cl.
   *H04N 21/47*   (2006.01)
(52) U.S. Cl. ...................................................... 725/152
(58) Field of Classification Search .................. None
   See application file for complete search history.

(56) References Cited

U.S. PATENT DOCUMENTS

| 7,302,693 | B2 * | 11/2007 | Windheim et al. | 719/330 |
| 2006/0020950 | A1 | 1/2006 | Ladd et al. | |
| 2008/0196038 | A1 * | 8/2008 | Antonio et al. | 719/313 |
| 2009/0055881 | A1 * | 2/2009 | Aoki et al. | 725/100 |

OTHER PUBLICATIONS

Java (registered trademark) standard, "Java Media Framework API Guide", Nov. 19, 1999, JMF 2.0 FCS, 265 pages.
"OpenCable (registered trademark) Application Platform Specifications", OCAP1.0 Profile, OC-SP-OCAP1.0.1-070824, Aug. 24, 2007, 629 pages.

* cited by examiner

*Primary Examiner* — Andrew Y Koenig
*Assistant Examiner* — Jasmine Stokely-Collins
(74) *Attorney, Agent, or Firm* — Wenderoth, Lind & Ponack, L.L.P.

(57) ABSTRACT

A broadcasting receiver implements volume control by first software (OCAP application) for volume control obtained from outside or second software (receiver application) for volume control pre-installed. The broadcasting receiver determines whether the first software is obtained or not. When it is determined that the first software is obtained, the broadcasting receiver sends a volume control command which is received by a command receiver to the first software, and otherwise, sends the volume control command to the second software.

8 Claims, 8 Drawing Sheets

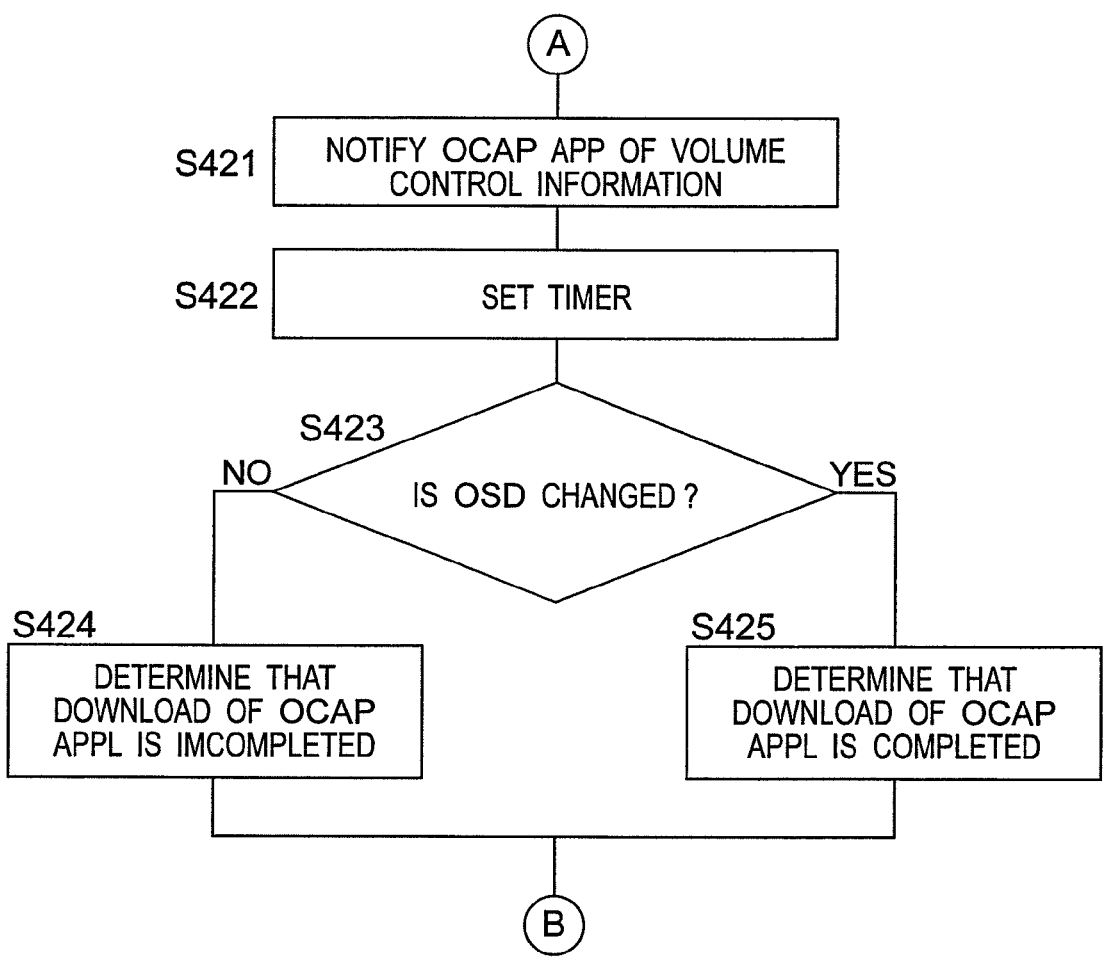

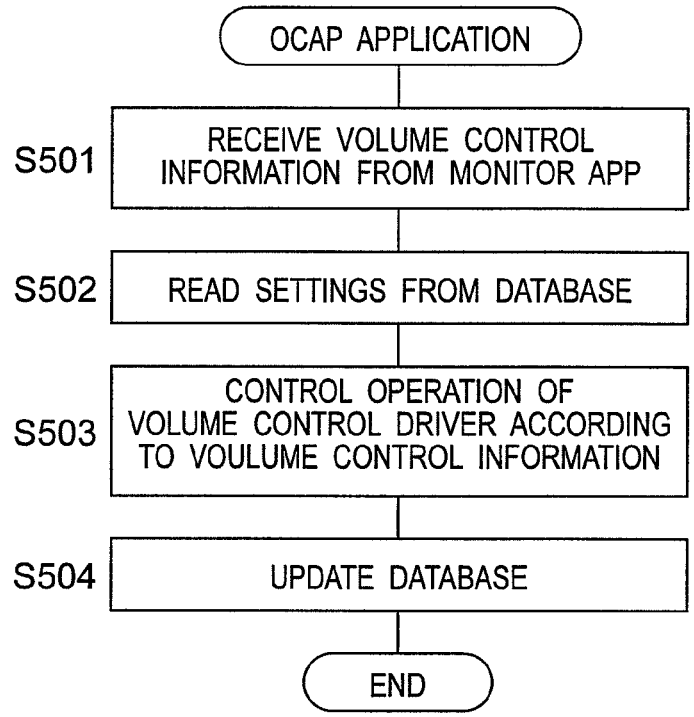
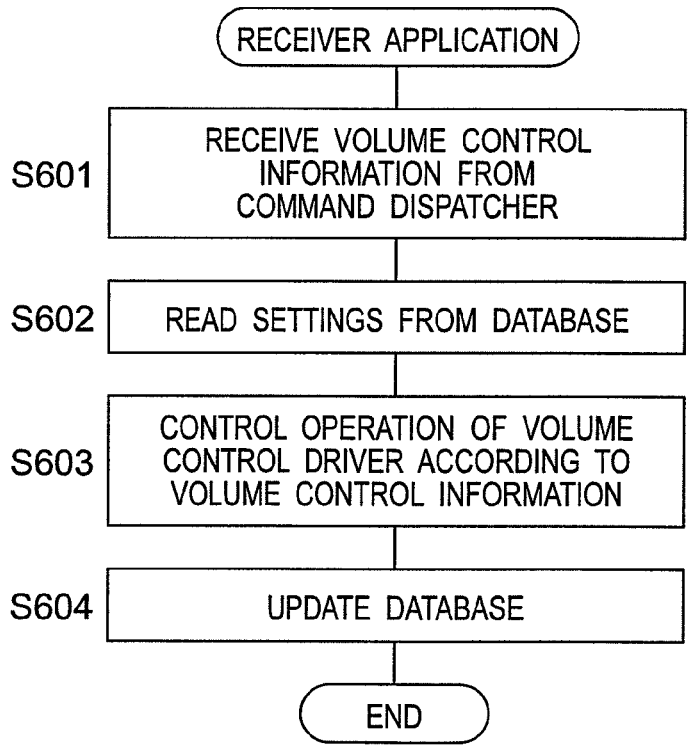

Fig.9

|  | ON SHIPMENT | WITH RECEIVER APP ONLY | WITH OCAP APP |
|---|---|---|---|
| MINIMUM VOLUME SPECIFIED VALUE OF RECEIVER | 1 | | |
| MAXIMUM VOLUME SPECIFIED VALUE OF RECEIVER | 50 | | |
| VOLUME SETTING VALUE | 20 (INITIAL VALUE) | 25 | 10 |
| SOUND PRESSURE LEVEL | 0.4 (INITIAL VALUE) | 0.5 | 0.2 |

Fig.10

|  | ON SHIPMENT | WITH RECEIVER APP ONLY | WITH OCAP APP |
|---|---|---|---|
| MINIMUM VOLUME SPECIFIED VALUE OF RECEIVER | 1 | | |
| MAXIMUM VOLUME SPECIFIED VALUE OF RECEIVER | 50 | | |
| MINIMUM VOLUME VALUE OF RECEIVER APP | 1 | | |
| MAXIMUM VOLUME VALUE OF RECEIVER APP | 64 | | |
| MINIMUM VOLUME VALUE OF OCAP APP | 1 | | |
| MAXIMUM VOLUME VALUE OF OCAP APP | 255 | | |
| VOLUME SETTING VALUE | 20 (INITIAL VALUE) | 23.9 | 20.96 |
| SOUND PRESSURE LEVEL | 0.4 (INITIAL VALUE) | 0.478 | 0.419 |

BROADCASTING RECEIVER AND VOLUME CONTROL METHOD THEREOF

BACKGROUND OF THE INVENTION

1. Field of the Invention

The present invention relates to a broadcasting receiver, and more particularly to a broadcasting receiver capable of volume control which is achieved with volume control software obtained through a broadcast wave or the like from outside in addition to pre-installed volume control software. The present invention also relates to a volume control method of a broadcasting receiver.

2. Related Art

Conventionally, OCAP (Open Cable Application Platform (registered trademark)) is known as a standard for cable television broadcasting. The OCAP standard is a North American digital CATV standard, which is a standard developed by a North American cable television standardization organization based on a European digital TV standard "DVB-MHP". The OCAP standard defines middleware to absorb difference in hardware between different receiver manufacturers and to provide the same service independently of hardware.

According to the OCAP standard, the following scheme is employed. That is, software for implementing various functions is multiplexed in a broadcast wave and then transmitted from a broadcast station. Each receiver downloads software multiplexed in the broadcast wave to perform a new function (refer to Patent Document 1). By this, in addition to video and audio digital broadcast, interactive services, Internet services, and so on can be implemented by digital CATV.

Patent Document 1: U.S. Patent Application Publication No. 2006/0020950

Non-Patent Document 1: OpenCable (registered trademark) Platform Specifications, OCAP 1.0 Profile Non-Patent Document 2: Java (registered trademark) standard, Java Media Framework API guide For example, according to the OCAP standard, OCAP software for volume control (hereinafter, referred to as an "OCAP application") for performing volume control needs to be downloaded. Hence, a problem may occur that until download of an OCAP application for volume control is completed, volume change by the OCAP application cannot be performed. To avoid the problem, the receiver needs to be provided with an original pre-installed software (hereinafter, referred to as a "receiver application") for volume control.

In addition, after download of the OCAP application is completed, two pieces of software for volume control, i.e., the OCAP application and the receiver application, exist, and therefore exclusive control of execution is required between the two applications.

Furthermore, since information such as a volume setting value is not shared between the two applications, a problem occurs, for example, that the volume setting value temporarily may become discontinuous along with switching between the applications.

SUMMARY OF THE INVENTION

The present invention is directed to solve the above-described problems and has a purpose to provide a broadcasting receiver that enables volume control before receiving software for volume control and enables smooth switching between pre-installed software and downloaded software for volume control.

In a first aspect of the present invention, provided is a broadcasting receiver which implements a volume control function by first software for volume control obtained from outside or second software for volume control pre-installed. The broadcasting receiver includes: a command receiving unit that receives a volume control command from a user; a volume controller that controls volume to be outputted, which is controlled by the first or second software based on the volume control command; a receiving unit that receives a broadcast wave; a obtaining unit that obtains the first software contained in the received broadcast wave; a determining unit that determines whether the first software is obtained; and a command dispatching unit that sends the volume control command received by the command receiving unit to the first software when it is determined based on a result of the determination that the first software is obtained, and sends the volume control command to the second software when it is not determined based on a result of the determination that the first software has been obtained.

In a second aspect of the present invention, provided is a control method for controlling volume of a broadcasting receiver by first software for volume control obtained from outside or second software for volume control pre-installed in the broadcasting receiver. The control method includes: receiving a broadcast wave through a receiving unit; obtaining the first software contained in the broadcast wave; determining whether the first software is obtained; receiving a volume control command through a command receiving unit; and when it is determined based on a result of the determination that the first software is obtained, transmitting the received volume control command to the first software, and controlling a volume controller of the broadcasting receiver by the first software, and when it is not determined that the first software is obtained, transmitting the volume control command to the second software, and controlling the volume controller by the second software.

In a third aspect of the present invention, provided is a program for controlling volume of a broadcasting receiver by first software for volume control obtained from outside or second software for volume control pre-installed in the broadcasting receiver. The control program causes a controller of the broadcasting receiver to execute the procedures of: receiving a broadcast wave through a receiving unit; obtaining the first software contained in the broadcast wave; determining whether the first software is obtained; receiving a volume control command through a command receiving unit; and when it is determined based on a result of the determination that the first software is obtained, transmitting the received volume control command to the first software, and controlling a volume controller of the broadcasting receiver by the first software, and when it is not determined that the first software is obtained, transmitting the volume control command to the second software, and controlling the volume controller by the second software.

The above-described control program may be stored in a computer-readable storage medium.

According to the present invention, volume control is enabled regardless of whether download of software for volume control is completed. After the download of software for volume control is completed, smooth switching from software for volume control pre-installed in a receiver to the downloaded software for volume control is enabled. Even when software for volume control is switched, volume can be continuously changed, improving user operability.

BRIEF DESCRIPTION OF THE DRAWINGS

FIG. 5B is a flowchart (continued from FIG. 5A) showing a process performed by the command dispatcher.

FIG. 7 is a flowchart showing a process performed by an OCAP application.

FIG. 8 is a flowchart showing a process performed by a receiver application.

FIG. 9 is a diagram showing an example of volume management information to be stored in a database.

FIG. 10 is a diagram showing another example of the volume management information to be stored in the database.

DETAIL DESCRIPTION OF PREFERRED EMBODIMENTS

An embodiment of the present invention will be described in detail below with reference to the accompanying drawings.

1. Configuration of Broadcasting Receiver

Figure 1:
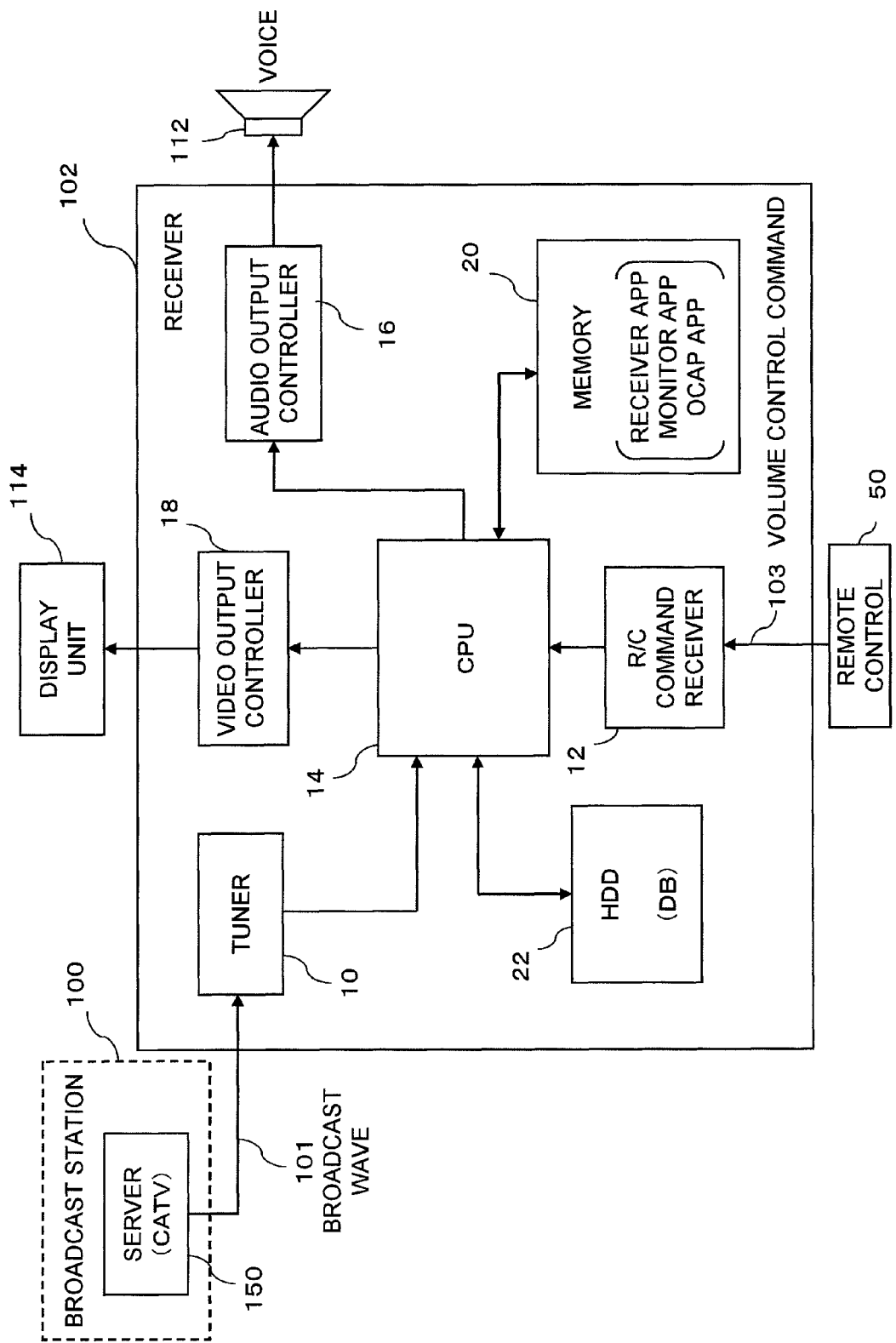
FIG. 1 is a diagram showing a hardware configuration of a broadcasting receiver according to one embodiment of the present invention.

FIG. 1 is a diagram showing a hardware configuration of a receiver according to one embodiment of the present invention, which receives a cable broadcast. A receiver 102 that receives a cable broadcast from a cable broadcast station 100 is connected through a cable to a server 150 that is set up in the broadcast station 100 and provides a cable broadcast. The server 150 transmits software (OCAP applications) for implementing various functions defined in an OCAP (OpenCable Application Platform) standard, monitor software (hereinafter, referred to as a "monitor application") for monitoring OCAP applications, and so on, in addition to video and audio digital broadcasts, by multiplexing them into a broadcast wave 101. The receiver 102 obtains these video and audio digital broadcasts, software, and so on through a tuner 10.

The receiver 102 receives user operation information (key code) through a remote control 50 and performs a process according to the operation. The receiver 102 of the present embodiment can receive cable broadcasts that comply with the OCAP standard.

A CPU 14 is a controller that controls the operation of the receiver 102. The CPU 14 are connected to a hard disk drive (HDD) 22 which is data storage means and a memory 20 which is nonvolatile storage means. The hard disk drive (HDD) 22 stores a database (DB) that contains volume control information required for volume control. The volume control information will be described in detail later. The memory 20 stores a monitor application and an OCAP application. The monitor application is software that performs overall control of other software. The OCAP application is software for implementing a predetermined function of the receiver 102 and is downloaded into the receiver 102 through the broadcast wave 101 from the server 150 in the broadcast station. Furthermore, The memory 20 stores software (receiver application) for implementing a certain function in the receiver 102 before the OCAP application is downloaded.

The receiver 102 further includes a remote control (R/C) receiver 12 for receiving a signal from the remote control 50.

A display unit 114 displays video image reproduced by the pre-installed application or the OCAP application or video image which is received. A sound output device 112 outputs sound reproduced by the pre-installed application or the OCAP application or sound which is received. The receiver 102 includes a video output controller 18 for controlling a video signal to be outputted to the display unit 114, and an audio output controller 16 for controlling an audio signal to be outputted to the sound output device 112.

Note that the receiver 102 includes, in addition to the above-described components, a cable card interface for exchanging data with a cable card, a cable modem for connecting to the Internet through a cable, an ether chip for transmitting and receiving an ether packet, and so on, detail description of these components is omitted.

Figure 2:
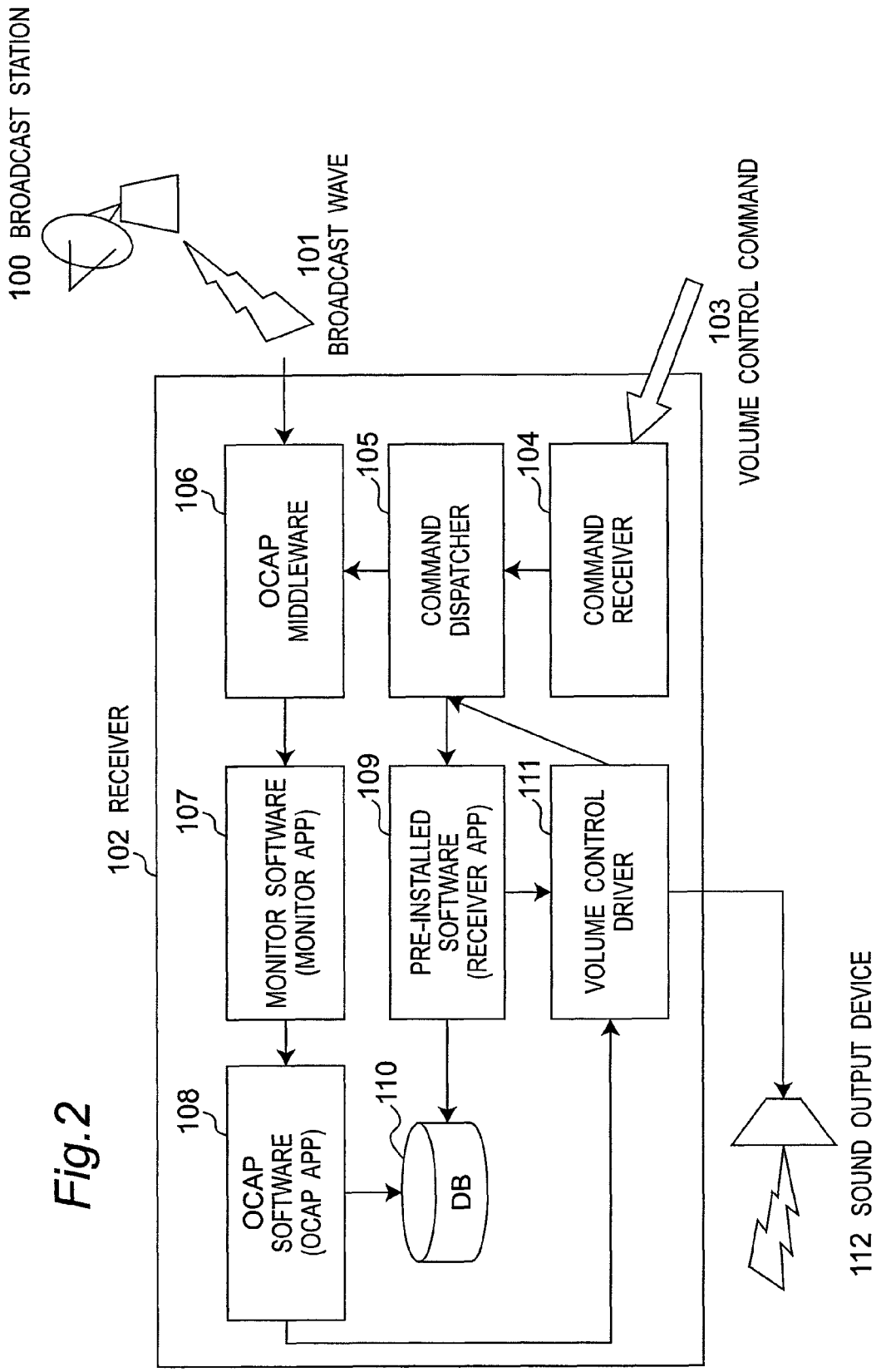
FIG. 2 is a diagram showing a functional configuration of the broadcasting receiver according to the one embodiment of the present invention.

FIG. 2 shows a functional configuration of the receiver 102 of the present embodiment. The functional configuration shown in FIG. 2 is implemented by the CPU 14 executing a predetermined program. Note that for convenience of description FIG. 2 only shows primary functions in the present embodiment. Needless to say, functions of the receiver 102 described later (not shown in FIG. 2) can be implemented by the CPU 14 executing a predetermined program.

As shown in FIG. 2, the receiver 102 includes a command receiver 104, a command dispatcher 105, OCAP middleware 106, a monitor application 107, an OCAP application 108, a receiver application 109, a database (hereinafter, referred to as the "DB") 110, and a volume control driver 111.

The command receiver 104 corresponds to the function of the remote control receiver 12. For example, the command receiver 104 monitors at all times a volume control command 103 received through the remote control 50 from a user. When receiving a volume control command 103, the command receiver 104 notifies the command dispatcher 105 of control information indicated by the volume control command 103.

The volume control driver 111 is software that controls the operation of the audio output controller 16.

The monitor application 107 and the OCAP application 108 are software that is downloaded from the server 150 in the broadcast station 100 and then installed into the receiver 102. On the other hand, the pre-installed software (receiver application) 109 is pre-installed to the receiver 102 at the time of manufacturing of the receiver 102.

The receiver 102 receives a broadcast wave 101 at all times and all received information is sent to the OCAP middleware 106.

The OCAP middleware 106 monitors whether a monitor application 107 is present in the received broadcast wave 101. If present, then the monitor application 107 is downloaded. The monitor application 107 is software for performing integrally functions of download and control of other software (OCAP applications). When the monitor application 107 is not downloaded to the receiver 102, the OCAP application 108 is not to be downloaded.

The command dispatcher 105 determines whether download of the OCAP application 108 has been completed, and sends control information on volume control to either one of the OCAP middleware 106 and the receiver application 109 based on a result of the determination.

Specifically, when download of the OCAP application 108 has been completed, then the command dispatcher 105 notifies the OCAP middleware 106 of control information received from the command receiver 104. The control information is notified from the OCAP middleware 106 to the OCAP application 108 through the monitor application 107.

Based on the sent control information, the OCAP application 108 controls the volume control driver 111 to control the sound output device 112. At the same time, the OCAP application 108 stores the sent control information such as a sound pressure level in the DB 110.

On the other hand, when download of the OCAP application 108 has not been completed, then the command dispatcher 105 notifies the receiver application 109 of the control information. Based on the notified control information, the receiver application 109 controls the volume control driver 111 to control the sound output device 112, and at the same time, stores the sent control information such as a sound pressure level in the DB 110.

The control information, such as a sound pressure level, stored in the DB 110 can be referred to by both the OCAP application 108 and the receiver application 109.

2. Operation of Broadcasting Receiver

The operation of the receiver 102 will be described in more detail below with reference to FIGS. 3 to 10. Note that in the following description an OCAP application for volume control is simply referred to as an OCAP application.

(1) Function of Monitor Application

Figure 3:
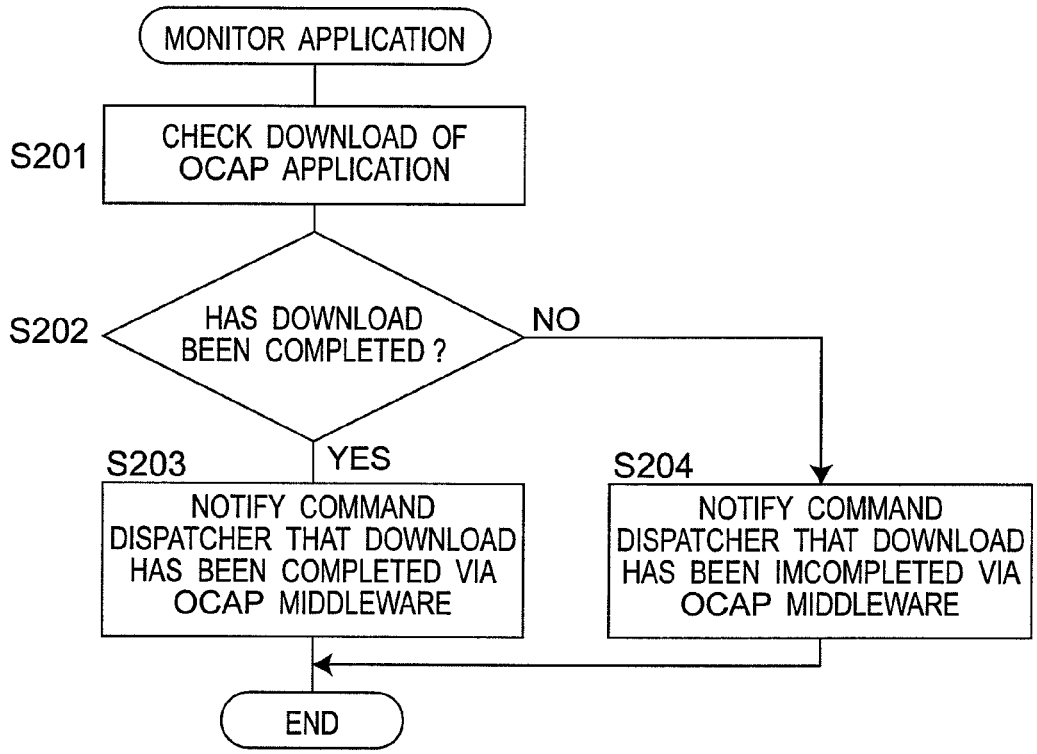
FIG. 3 is a flowchart showing a process performed by a monitor application.

FIG. 3 is a flowchart showing part of the operation (function) of the monitor application 107. The monitor application 107 is software that performs overall control of other software and grasps all downloaded software.

The command dispatcher 105 makes a request to the monitor application 107 using an API (Application Program Interface) and so on, so that the monitor application 107 notifies the command dispatcher 105 of completion of the download when an OCAP application is downloaded.

In response to the request from the command dispatcher 105, the monitor application 107 checks using an API, and so on, whether an OCAP application 108 for performing volume control is downloaded (step S201). Here, as the API, an API defined in the OCAP standard or an API defined in the Java (registered trademark) standard can be used.

Note that it can be checked whether the download of the OCAP application 108 has been completed not only by a method using an API but also by a method of measuring and determining a change in the OSD (On Screen Display) area of the receiver 102. This method will be described in detail later.

If the download has been completed ("YES" at step S202), then the monitor application 107 notifies, through the OCAP middleware 106, the command dispatcher 105 that the download has been completed (step S203). At this time, in response to the notification, the command dispatcher 105 sets a dispatch destination of control information of volume control to the OCAP application. On the other hand, if the download has not been completed ("NO" at step S202), then the monitor application 107 notifies, through the OCAP middleware 106, the command dispatcher 105 that the download has not been completed (step S204). At this time, in response to the notification, the command dispatcher 105 sets a dispatch destination of control information of volume control to the pre-installed application.

Note that check as to whether the download of the OCAP application 108 has been completed may be done every time notification from the OCAP middleware 106 of volume control information is provided or done regularly by the monitor application 107.

(2) Function of Volume Control Driver

Figure 4:
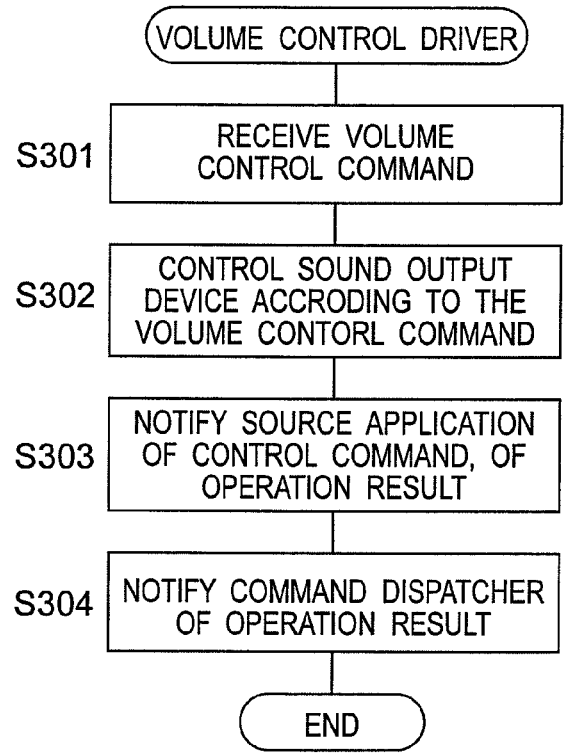
FIG. 4 is a flowchart showing a process performed by a volume control driver.

FIG. 4 is a flowchart showing the operation of the volume control driver 111.

The volume control driver 111 receives a command for volume control from the OCAP application 108 or the receiver application 109 (step S301), and operates (controls) the operation of the sound output device 112 based on the control command (step S302).

After performing control on the sound output device 112, the volume control driver 111 notifies a source application (the OCAP application 108 or the receiver application 109) which sends the control command of information as to whether the control has succeeded or failed (step S303). At the same time, the volume control driver 111 notifies the command dispatcher 105 of information indicating the source application and information indicating success/fault of the control (step S304).

(3) Function of Command Dispatcher

Figure 5A:
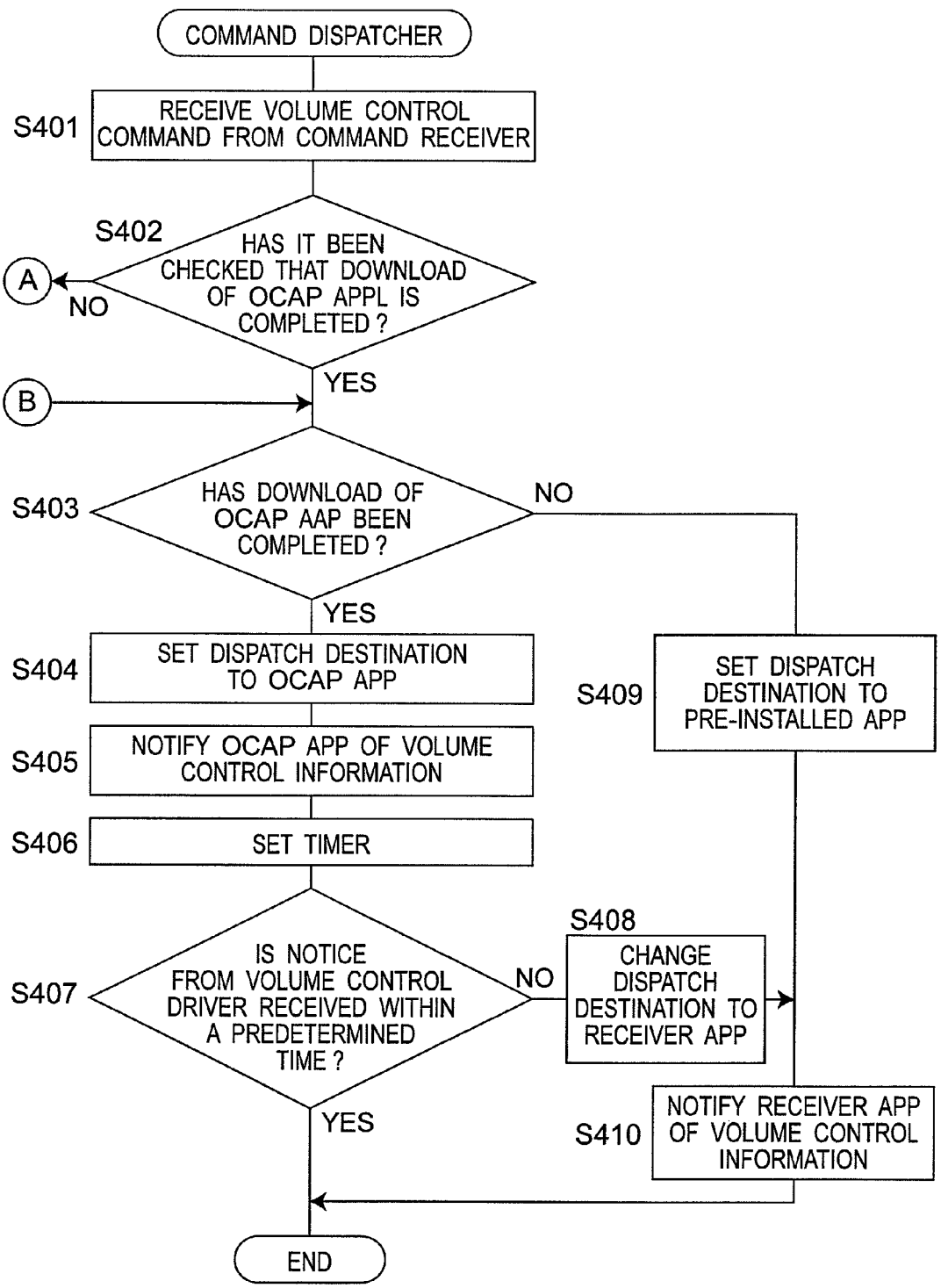
FIG. 5A is a flowchart showing a process performed by a command dispatcher.

With reference to FIGS. 5A and 5B, an operation of dispatching control information by the command dispatcher 105 will be described.

The command dispatcher 105 receives control information of a volume control command 103 from the command receiver 104 (step S401). The command dispatcher 105 stores the received control information in a temporary storage area (not shown) such as an EEPROM, and determines to which application of the OCAP middleware 106 and the receiver application 109 the received control information is to be sent. To make this determination, the command dispatcher 105 first determines whether completion/incompletion of download of an OCAP application 108 has been checked (step S402). If completion/incompletion of download of the OCAP application 108 has been checked, then the process proceeds to step S403.

If completion/incompletion of download of the OCAP application 108 has not been checked, that is, if the command dispatcher 105 has not received any notification about completion/incompletion of download from the monitor application 107, then the command dispatcher 105 notifies the OCAP application 108 of the received control information and determines whether download of the OCAP application 108 has been completed (steps S421 to S425 in FIG. 5B).

Figure 6:
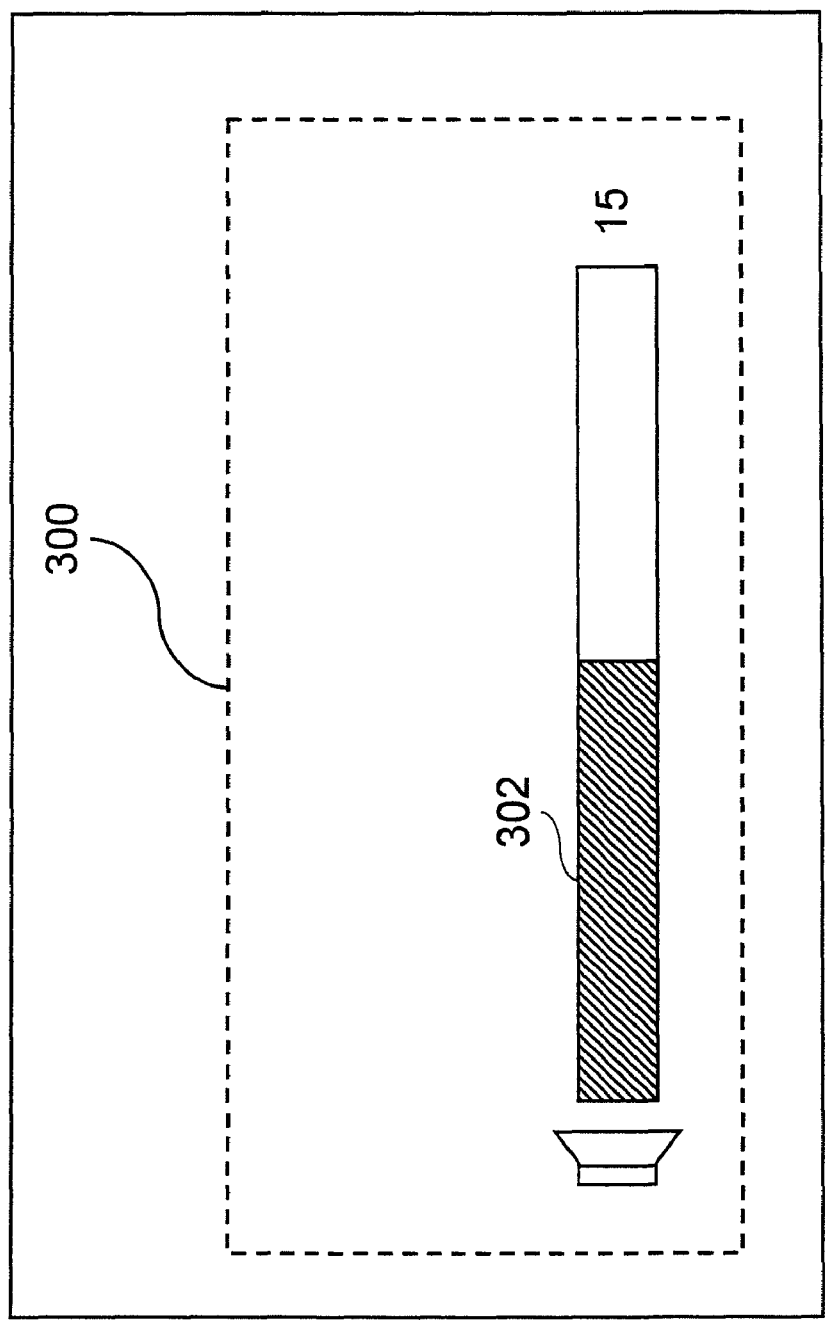
FIG. 6 is a diagram describing OSD (On Screen Display) display.

Specifically, the command dispatcher 105 sends the control information to the OCAP application 108 through the OCAP middleware 106 (step S421). If the OCAP application 108 for volume control has been downloaded, then OSD (On Screen Display) for volume control is displayed on a screen of the display unit 114 by the OCAP application 108 according to the control information. Here, the OSD is display for various settings which is provided on the screen of the display unit 114. For example, as shown in FIG. 6, a display bar 302 for volume control is displayed within a predetermined display area (hereinafter, referred to as the "OSD display area") 300. If the OCAP application 108 for volume control has not been downloaded, then no change is made on the screen. Thus, by monitoring a change in the display of the OSD display area 300, it can be determined whether the OCAP application 108 for volume control has been downloaded.

The command dispatcher 105 sends the control information to the OCAP application 108 through the OCAP middleware 106 (step S421), simultaneously stores an area of the OSD display area at that point in the temporary storage area, and performs a timer setting (step S422). It is determined whether there is a change in the area of the OSD display area within the time set by the timer setting (step S423).

If there is no change in the OSD display area, then it is determined that the OCAP application 108 has not presented the OSD display for volume information, and thus it is determined that download of the OCAP application 108 has not been completed (step S424). Thereafter, the process proceeds to step S403 (see FIG. 5A). On the other hand, if there is a change in the area of the OSD display area, then it is determined that the OCAP application 108 has presented the OSD display for volume information according to the control information, and thus it is determined that download of the OCAP application 108 has been completed (step S425). Thereafter, the process proceeds to step S403 (see FIG. 5A).

As such, in the present embodiment, when it is unknown whether download of an OCAP application has been completed, the command dispatcher 105 temporarily sends control information to the OCAP application 108 and monitors a change in the OSD display area so as to determine whether download of the OCAP application 108 has been completed. By this method, even when the OCAP application 108 has been actually downloaded but the command dispatcher 105 has not received notification from the monitor application 107 of completion of the download due to some kind of trouble, it is possible to check that the download of the OCAP application 108 has been actually completed.

Returning to FIG. 5A, at step S403, the command dispatcher 105 determines whether download of the OCAP application 108 has been completed. The command dispatcher 105 can determine whether download of the OCAP application 108 has been completed according to a determination result as to completion/incompletion of download based on notification from the monitor application 107 or a change in the area of the OSD display area. If download of the OCAP application 108 has not been completed, then, the command dispatcher 105 sets the receiver application 109 as a dispatch destination of the control information (step S409). To do so, the command dispatcher 105 notifies the receiver application 109 of the control information (step S410).

If download of the OCAP application 108 has been completed, then, the command dispatcher 105 sets the OCAP application 108 as a dispatch destination of the control information (step S404). Thus, the command dispatcher 105 notifies the OCAP application 108 of the control information through the OCAP middleware 106 (step S405), and simultaneously sets a timer for waiting for notification from the volume control driver 111 (step S406). Here, when a determination that download has been completed is made based on the change in the area of the OSD display area, the step S405 is skipped. That is, after setting the OCAP application 108 as the dispatch destination of the control information (step S404), the process moves straight to the timer setting (step S406) for waiting for notification from the volume control driver 111.

If the command dispatcher 105 is able to receive notification of a control result from the volume control driver 111 within the timer set time ("YES" at step S407), then it can be determined that the control information has been transferred to the OCAP application 108. In this case, there is no need to change the dispatch destination and thus the process ends.

On the other hand, if the command dispatcher 105 is unable to receive notification from the volume control driver 111 within the time ("NO" at step S407), then it can be determined that the control information has not been transferred to the volume control driver 111 although download of the OCAP application 108 has been completed. Thus, in this case, the dispatch destination of the control information is changed to the receiver application 109 (step S408) and the control information stored in the temporary storage area is sent to the receiver application 109 (step S410) to achieve volume control by the receiver application 109.

(4) Function of OCAP Application

FIG. 7 is a flowchart showing the operation of the OCAP application 108.

When the OCAP application 108 receives control information of volume control from the monitor application 107 (step S501), the OCAP application 108 reads out a current volume setting value for the OCAP application 108 from volume management information stored in the DB 110 (step S502). The OCAP application 108 reflects the control information to the read setting value and performs control (operation) on the volume control driver 111 using the reflected value (step S503). At the same time, the OCAP application 108 stores, to the DB 110, the reflected value set to the volume control driver 111, in a format (dB (decibel) or sound pressure level value) defined in the Java (registered trademark) standard as volume control information (step S504). At this time, the volume setting value by the OCAP application 108 is converted to a format that can be recognized by the receiver application 109 and the converted value is also stored in the DB 110 as new volume management information.

(5) Function of Pre-Installed Application

FIG. 8 is a flowchart showing the operation of the receiver application 109.

When the receiver application 109 receives control information of volume control from the command dispatcher 105 (step S601), the receiver application 109 reads out a current volume setting value for the receiver application 109, from volume management information stored in the DB 110 (step S602). The receiver application 109 reflects the control information to the read setting value and performs operation (control) on the volume control driver 111 by a method defined in the receiver 102, using the reflected setting value (step S603). At the same time, the receiver application 109 converts information used for the control to a dB (decibel) or sound pressure level that complies with the Java (registered trademark) standard (step S604), and stores the converted value together with the value obtained before the conversion (the setting value to which the control information is reflected), in the DB 110 as new volume management information (step S604).

Converting control information to a value in a format that complies with the Java (registered trademark) standard and storing the value in the DB 110 allows the OCAP application 108 installed by the Java (registered trademark) to refer to such information. By this, the OCAP application 108 can recognize volume management information changed by the receiver application 109 and can control volume continuously from the volume set by the receiver application 109.

(6) Volume Management Information

Referring to FIGS. 9 and 10, volume management information stored in the DB 110 which is updated at step S504 in FIG. 7 and step S604 in FIG. 8 will be described in detail. The volume management information is information to be referred to by the receiver application 109 and the OCAP application 108 when volume control is done.

In the example of FIG. 9, "1" is set as the minimum volume specified value and "50" is set as the maximum volume specified value set upon shipment of the receiver 102. A volume setting values (initial value) upon shipment is set to "20", and "0.4" is set as a sound pressure level (initial level) corresponding thereto.

FIG. 9 shows the case in which the values of the volume minimum level and volume maximum level of the receiver 102 are the same as the volume minimum values and volume maximum values of the OCAP application 108 and the receiver application 109. Namely, the OCAP application 108 and the receiver application 109 change volume in the same scale.

Until the OCAP application 108 for volume control is downloaded, volume control of the receiver 102 is achieved by the receiver application 109. For example, when, immediately after shipment of the receiver 102, the command receiver 104 receives a volume control command 103 to turn up volume by "5" level, the command receiver 104 notifies, of such control information, the command dispatcher 105 which in turn notifies the receiver application 109 of the control information.

The receiver application 109 reads out a volume setting value (initial value) of "20" from the DB 110, adds a value of "5" sent as the control information to the setting value "20" to obtain a setting value of "25". Using the setting value "25", the receiver application 109 controls (operates) the volume control driver 111 to achieve volume control. After the control is done, the receiver application 109 newly stores the value "25" in the DB 110 as a volume setting value. At the same time, the receiver application 109 converts the setting value "25" to a sound pressure level defined in the Java (registered trademark) standard (the volume minimum value in the receiver 102 is defined to be 0.0 and the maximum value is defined to be 1.0) and stores a converted value of "0.5" in the DB 110.

After the OCAP application 108 for volume control is downloaded, volume control of the receiver 102 is achieved by the OCAP application 108. Hence, the command dispatcher 105 notifies the OCAP application 108 of control information of the volume control.

Thus, when, after the above-described volume setting, the command receiver 104 receives a volume control command 103 to turn down the volume by "15" levels defined according to a volume scale of the OCAP application 108, the command receiver 104 notifies, of such control information, the command dispatcher 105 which in turn notifies the OCAP application 108 of the control information.

The OCAP application 108 reads out a sound pressure level of "0.5" defined according to the Java (registered trademark) standard from the DB 110, changes the sound pressure level to "0.2" according to the control information (i.e., volume is turned down by "15"), and operates the volume control driver 111, so that volume control is performed. Then, a setting value of "10" (=25−15) obtained after performing the volume control is stored in the DB 110 as a new setting value and a sound pressure level of "0.2" corresponding thereto is also stored in the DB 110.

FIG. 10 shows another example of the volume management information. FIG. 10 shows the case in which the volume maximum value defined by the receiver 102, the volume maximum value defined by the OCAP application 108, and the volume maximum value defined by the receiver application 109 are different from one another. That is, FIG. 10 shows the case in which the number (resolutions) of steps for changing a volume setting is different therebetween.

In FIG. 10, the volume maximum value of "64" of the receiver application 109 corresponds to the volume maximum specified value of "50" of the receiver 102. That is, when the volume value of the receiver application 109 is increased/decreased by "1.28", the volume specified value of the receiver 102 is increased/decreased by "1".

The volume maximum value "255" of the OCAP application 108 corresponds to the volume maximum specified value of "50" of the receiver 102. That is, when the volume value of the OCAP application 108 is increased/decreased by "5.1", the volume specified value of the receiver 102 is increased/decreased by "1".

As with the case of FIG. 9, until download of the OCAP application 108 for volume control is completed, the volume control of the receiver 102 is performed by the receiver application 109. For example, when, immediately after shipment of the receiver 102, the command receiver 104 receives a volume control command 103 to turn up volume by "5", the command receiver 104 notifies, of such control information, the command dispatcher 105 which in turn notifies the receiver application 109 of the control information.

The receiver application 109 converts the increase "5" sent as the control information, from a volume value of the receiver application 109 to a volume value of the receiver 102 to obtain the value "3.90". This converted value is added to a setting value (initial value) of "20" read out from the DB 110 to obtain the value "23.90". Using this value, the receiver application 109 operates the volume control driver 111 to perform volume control and stores a setting value of "23.90" obtained after the control to the DB 110. Simultaneously, the setting value "23.90" is converted to a sound pressure level of "0.478" defined in the Java (registered trademark) standard and the converted value is also stored in the DB 110.

After download of the OCAP application 108 for volume control is completed, the command dispatcher 105 notifies the OCAP application 108 of control information on volume control.

Thus, when, after the above-described volume setting, the command receiver 104 receives a volume control command 103 to turn down volume by "15" levels defined by a volume value scale of the OCAP application 108, the command receiver 104 notifies, of such control information, the command dispatcher 105, which in turn notifies the OCAP application 108 of the control information.

The OCAP application 108 converts an amount of decrease of "15" levels sent as the control information, from a volume value of the OCAP application 108 to a volume value of the receiver 102 to obtain the value "2.94" and further converts this value to a sound pressure level to obtain the value "0.059". The OCAP application 108 reads out from the DB 110 the previous sound pressure level "0.478" defined according to the Java (registered trademark) standard, and subtracts, according to the control information, the value "0.059" (=the volume value "15" of the receiver application 109) from the sound pressure level "0.478" to obtain "0.419". Using the value "0.419", the OCAP application 108 operates the volume control driver 111, so that volume control is performed. The OCAP application 108 stores, to the DB 110, a setting value of "20.96" and a sound pressure level of "0.419" which are obtained after performing the control.

As described above, in the present embodiment, the latest volume setting value is stored in the DB 110 in formats that can be recognized by each of the receiver application 109 and the OCAP application 108. By this, even when an application for volume control to be used is transitioned from a receiver application to an OCAP application, smooth volume variable control is enabled.

3. Conclusion

According to the present embodiment, regardless of whether download of the OCAP application 108 for volume control is completed or uncompleted, the volume control is enabled in the receiver 102. In addition, since volume setting information is shared, even when software to be used for volume control is switched between the OCAP application 108 and the receiver application 109, the volume can be continuously controlled.

Note that although the above description explains about software that performs volume control, the concept of the present invention is not limited thereto. Thus needless to say, the present invention can also be applied to software that performs other functions.

Note also that the above-described embodiment is one of preferred embodiments of the present invention, and the scope of the present invention is not limited thereto. Various changes and modifications may be made without departing from the spirit and scope of the present invention. The present application is related to Japanese Patent Application No. 2007-072288 (filed on Mar. 20, 2007), the content of which is incorporated herein by reference.

INDUSTRIAL APPLICABILITY

A broadcasting receiver of the present invention allows a user to easily perform volume control, regardless of whether an OCAP application that performs volume control is present therein. Even when a switch between an OCAP application and a receiver application occurs, since information on volume, and so on, is shared, the volume can be continuously controlled. Accordingly, the present invention is useful for a broadcasting receiver that downloads and executes software such as CATV.

What is claimed is:

1. A control method for controlling volume of a broadcasting receiver by first software for volume control obtained from outside or second software for volume control pre-installed in the broadcasting receiver, the control method comprising:
receiving a broadcast wave through a receiving unit;
obtaining the first software contained in the broadcast wave;
determining whether the first software is obtained;
receiving a volume control command through a command receiving unit; and
when it is determined based on a result of the determination that the first software is obtained, transmitting the received volume control command to the first software, and controlling a volume controller of the broadcasting receiver by the first software, and
when it is not determined that the first software is obtained, transmitting the volume control command to the second software, and controlling the volume controller by the second software.

2. A non-transitory computer-readable recording medium comprising a program for controlling volume of a broadcasting receiver by first software for volume control obtained from outside or second software for volume control pre-installed in the broadcasting receiver, the control program causing a controller of the broadcasting receiver to execute at least the procedures of:
receiving a broadcast wave through a receiving unit;
obtaining the first software contained in the broadcast wave;
determining whether the first software is obtained;
receiving a volume control command through a command receiving unit; and
when it is determined based on a result of the determination that the first software is obtained, transmitting the received volume control command to the first software, and controlling a volume controller of the broadcasting receiver by the first software, and
when it is not determined that the first software is obtained, transmitting the volume control command to the second software, and controlling the volume controller by the second software.

3. A broadcasting receiver which implements a volume control function by first software for volume control obtained from outside or second software for volume control pre-installed, the broadcasting receiver comprising:
a command receiving unit that receives a volume control command from a user;
a volume controller that controls volume to be outputted, which is controlled by the first or second software based on the volume control command;
a receiving unit that receives a broadcast wave;
an obtaining unit that obtains the first software contained in the received broadcast wave;
a determining unit that determines whether the first software is obtained; and
a command dispatching unit that sends the volume control command received by the command receiving unit to the first software when it is determined based on a result of the determination that the first software is obtained, and sends the volume control command to the second software when it is not determined based on a result of the determination that the first software has been obtained.

4. The broadcasting receiver according to claim 3, wherein the determining unit determines whether the first software is obtained, based on presence/absence of notification as to a control result from the volume controller, after the transmission of the volume control command to the first software for volume control.

5. The broadcasting receiver according to claim 3, wherein the determining unit determines whether the first software is obtained, using an API (Application Program Interface) defined in an OCAP (OpenCable Application Platform (registered trademark)) standard.

6. The broadcasting receiver according to claim 3, wherein the determining unit determines whether the first software is obtained, by monitoring a change in display which is provided on a screen upon volume control.

7. The broadcasting receiver according to claim 3 further comprising:
a converting unit that converts information about volume control of the volume controller by the second software to information in a format that can be recognized by the first software; and
a second storage means that stores the converted information about the volume control.

8. The broadcasting receiver according to claim 7, wherein the converting unit converts information about volume control of the volume controller to a format that can be recognized by an API (Application Program Interface) defined in a Java (registered trademark) standard.

* * * * *